(12) United States Patent
Hogan et al.

(10) Patent No.: US 6,325,853 B1
(45) Date of Patent: *Dec. 4, 2001

(54) APPARATUS FOR APPLYING A LIQUID COATING WITH AN IMPROVED SPRAY NOZZLE

(75) Inventors: Patrick Thomas Hogan, Lorain; David M. Selestak, Avon; Richard Zakrajsek, Lorain; William E. Donges, Wellington; Chris Havlik, Elyria; Greg Harrell, Clyde; Zygmunt Carl Omilion, Parma; Kevin Fox, Avon Lake, all of OH (US)

(73) Assignee: Nordson Corporation, Westlake, OH (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/878,756

(22) Filed: Jun. 19, 1997

Related U.S. Application Data

(63) Continuation-in-part of application No. 08/687,790, filed on Jul. 19, 1996, now abandoned.

(51) Int. Cl.[7] .......................................................... B05C 5/00
(52) U.S. Cl. .................... 118/300; 118/DIG. 2; 239/296; 239/297; 239/298; 239/300
(58) Field of Search ..................................... 118/263, 243, 118/300, DIG. 2; 239/296, 297, 298, 300, 301; 156/578

(56) References Cited

U.S. PATENT DOCUMENTS

| Re. 33,481 | 12/1990 | Ziecker et al. ........................ 239/298 |
|---|---|---|
| 4,815,660 | 3/1989 | Boger ........................................ 239/8 |
| 4,911,956 | 3/1990 | Gabryszewski et al. ............. 427/424 |
| 4,969,602 | 11/1990 | Scholl .................................. 239/298 |
| 5,186,982 | * 2/1993 | Blette et al. .......................... 118/263 |
| 5,194,115 | 3/1993 | Ramspeck et al. ................... 156/578 |
| 5,265,800 | 11/1993 | Ziecker et al. .......................... 239/1 |
| 5,294,459 | 3/1994 | Hogan et al. .......................... 427/96 |
| 5,382,312 | 1/1995 | Raterman .............................. 156/500 |
| 5,431,343 | 7/1995 | Kubiak et al. ....................... 239/105 |

FOREIGN PATENT DOCUMENTS

| 0 293 065 | 11/1988 | (EP) . |
|---|---|---|
| 0 362 548 | 4/1990 | (EP) . |
| 0 578 084 | 1/1994 | (EP) . |
| 0 584 973 | 3/1994 | (EP) . |
| WO 91/12088 | 8/1991 | (WO) . |

* cited by examiner

*Primary Examiner*—Laura Edwards
(74) *Attorney, Agent, or Firm*—Calfee, Halter & Griswold, LLP

(57) ABSTRACT

Apparatus and methods for spray coating selected areas of a circuit board with a liquid coating material without coating regions of the circuit board to be left uncoated. In one mode of operation, a bead of liquid coating material dispensed from an elongated nozzle tip is atomized by directing jets of air pressurized against the bead to form a conical, swirling spray pattern which is sprayed on selected areas of a circuit board. In a second mode of operation, the non-atomized bead of liquid coating material dispensed through the elongated nozzle tip is applied on selected areas of the circuit board. In a third mode of operation, jets of pressurized air are directed against the bead of liquid coating material to create a soft swirl pattern, without atomizing the bead of coating material. In a second embodiment of the invention, the bead of liquid coating material is dispensed from a nozzle without the elongated nozzle tip.

22 Claims, 5 Drawing Sheets

APPARATUS FOR APPLYING A LIQUID COATING WITH AN IMPROVED SPRAY NOZZLE

CROSS-REFERENCE TO RELATED APPLICATIONS

This is a continuation-in-part of commonly-owned, copending U.S. patent application Ser. No. 08/687,790 filed Jul. 19, 1996 now abandoned.

FIELD OF THE INVENTION

This invention relates to applying a liquid to a substrate either as an atomized or nonatomized spray pattern. More particularly, the invention relates to an improved method and apparatus for selectively applying a coating of material on desired regions of a substrate such as a circuit board while avoiding the deposit of coating material on regions to be left uncoated.

BACKGROUND OF THE INVENTION

Typically, circuit boards that require protection from moisture, electric leakage and dust are coated with moisture proof insulative films, known as conformal coatings, such as, acrylic, polyurethane, silicone or epoxy synthetic resins dissolved in a volatile solvent. When applied to clean circuit boards, an insulative resin film of uniform thickness and without pinholes, is formed as the solvent evaporates.

Spraying is the most commonly used insulative coating method employed in mass production. Spraying can be categorized as either air spraying in which an air stream is impinged against the stream of liquid coating material after leaving the spray nozzle to form an atomized spray pattern, or airless spraying in which the coating material is dispensed as a nonatomized spray pattern, as is disclosed in U.S. Pat. No. 5,294,459, assigned to Nordson Corp., which is hereby incorporated by reference in its entirety.

In airless spraying of conformal coating material, as described in the U.S. Pat. No. 5,294,459, the coating material is sprayed onto a circuit board as a flat, nonatomized pattern. Relative movement is effected between the nozzle and the circuit board in a direction transverse to the plane of the flat pattern discharged from the nozzle. The supply of coating material to the nozzle is intermittently interrupted so as to prevent a deposit of liquid coating on regions of the circuit board and/or circuit components which are to be left uncoated.

While air spraying, in which an air stream is impinged against the stream of liquid coating material to atomize the material after leaving the spray nozzle, as disclosed in the U.S. Pat. No. 5,294,459, has proven to be an effective means of applying the material to a substrate, there is still some overspray which increases the production costs of the circuit boards. Even with airless spraying, the distance of the nozzle to the circuit board sometimes causes the coating material to coat regions which are to be left uncoated.

OBJECTS AND SUMMARY OF THE INVENTION

It is an object of the present invention to provide apparatus and methods for coating substrates, such as circuit boards, with either a bead or an atomized conical, or a swirling spray pattern of liquid coating material discharged from a nozzle mounted to a liquid spray device to obviate the problems and limitations of the prior art systems.

It is a further object of the present invention to provide an apparatus and method having three modes of operation for selectively coating substrates, such as circuit boards, with either a bead of liquid coating material dispensed through an elongated nozzle tip or with an atomized, conical spray pattern formed by directing jets of relatively high pressurized air against the bead of liquid coating material dispensed through the elongated nozzle tip, or with a non-atomized, softswirling spray pattern formed by directing jets of relatively low pressurized air against the bead of liquid coating material dispensed through the nozzle.

It is another object of the present invention to direct a portion of the jets of pressurized air against the bead of liquid coating material dispensed through the elongated nozzle tip and a portion of the pressurized air against the nozzle tip to stabilize the nozzle tip.

It is another object of the present invention to minimize the volume of residual coating material present in the throughbore, consequently minimizing or substantially eliminating drip and dribble during startup.

It is another object of the present invention to minimize pressure spikes when initiating a pressure-assisted mode of operation, consequently minimizing or substantially eliminating splatter during startup.

In accordance with a first embodiment of the invention, a system and method for spray coating a substrate with a liquid coating material includes a liquid spray device having a liquid delivery passageway for supplying liquid coating material and an air delivery passageway for supplying pressurized air. A nozzle mounted to the liquid spray device has an elongated nozzle tip extending outwardly therefrom and a throughbore in flow communication with the liquid delivery passageway. A nozzle orifice disposed at the end of the throughbore discharges the liquid coating material as a bead of liquid coating material. The nozzle includes a plurality of bores in flow communication with the air delivery passage. Each of the bores is formed at an angle with respect to the throughbore to direct pressurized air against both the elongated nozzle tip and the outer periphery of the bead of liquid coating material discharged from the elongated nozzle tip to form the liquid coating material into an atomized, conical swirling spray pattern. A valve controller is connected to the liquid spray device for intermittently opening and closing the air delivery passageway of the liquid spray device whereby the bead of liquid coating material discharged from the nozzle orifice is applied to the substrate either as the atomized, conical, swirling spray pattern or as a bead of the liquid coating material.

In accordance with a second embodiment of the invention, the system and method of the first embodiment can be used with a nozzle constructed without the elongated nozzle tip.

In accordance with a third embodiment of the invention, pressurized air supplied to the spray nozzle is diverted to an exhaust port when operating the spray gun in a non-pressure-assisted mode of operation.

In accordance with a fourth embodiment of the invention, pressurized air supplied to the spray nozzle is reacted by a fluid damping system when initiating operation of the spray gun in a pressure-assisted mode of operation.

BRIEF DESCRIPTION OF THE DRAWINGS

The structure, operation, and advantages of the presently preferred embodiment of the invention will become further apparent upon consideration of the following description taken in conjunction with the accompanying drawings, wherein.

DETAILED DESCRIPTION OF THE INVENTION

Figure 1:
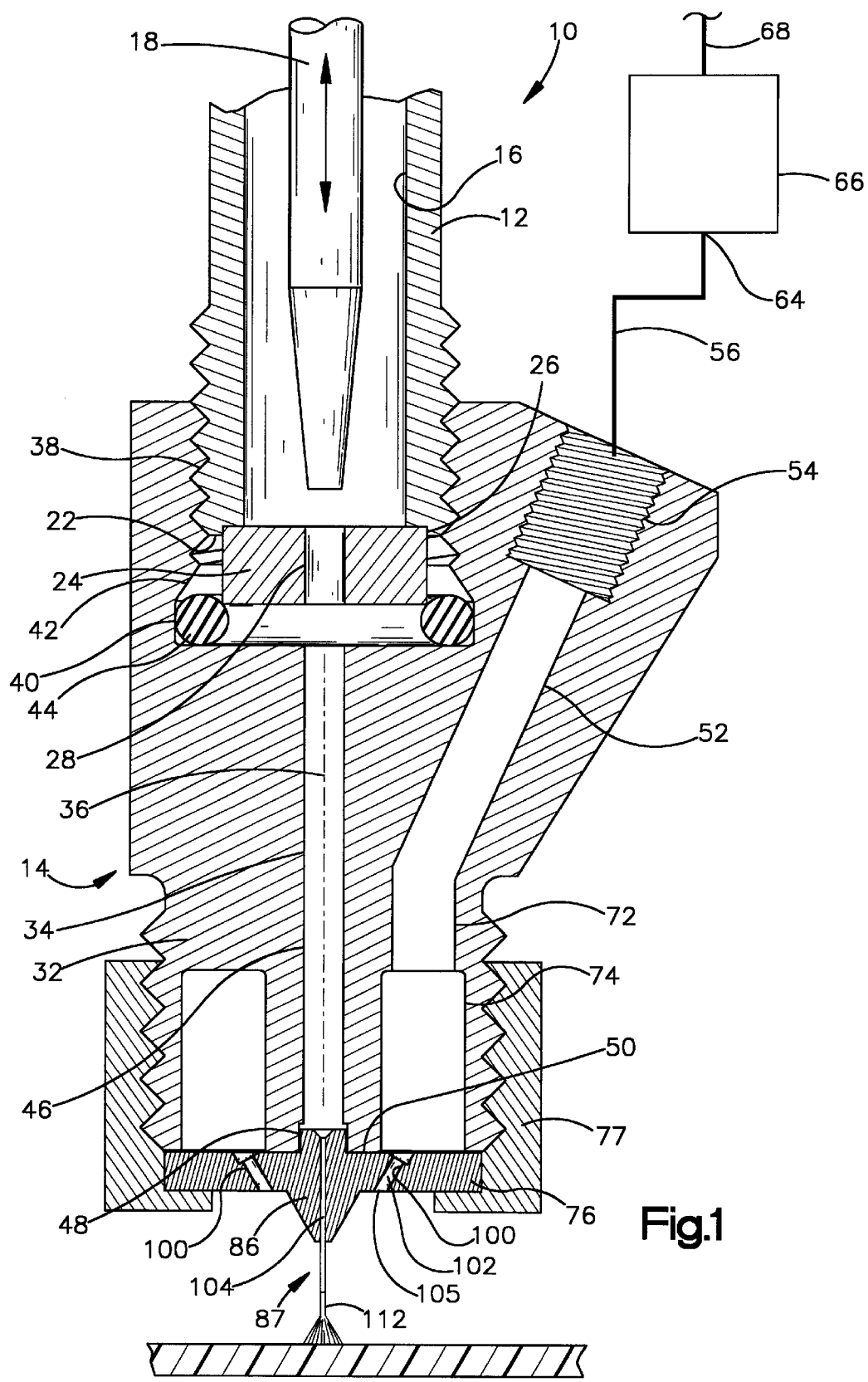
FIG. 1 is a side view, partly in cross section, of a coating system having an elongated nozzle with a plurality of air bores disposed thereabout in accordance with the present invention.

Referring to FIG. 1, a coating system 10 for selectively coating a substrate 11, typically a circuit board, with a moisture proof, insulative material is illustrated. The coating system 10 includes a spray gun (not shown) having a cylindrical extension (barrel) 12 with a nozzle assembly 14 attached thereto. The overall construction of the coating system 10 including a spray gun, a source of air and a source of coating material forms no part of this invention per se and is described only briefly herein. The nozzle assembly 14 could be attached, for example, to the threaded end of extension of a spray gun, such as the spray gun disclosed in U.S. Pat. No. 5,294,459, which is hereby incorporated by reference in its entirety. The spray gun is operated by a conventional robot which controls the movement of the spray gun in the x, y and z axes.

The cylindrical extension 12 has a throughbore 16 housing a reciprocating valve shaft 18 therein. Throughbore 16 is connected to a source (not shown) of pressurized, coating material 20 (see FIG. 2). The coating material includes a wide range of materials having a viscosity range of about 10 cps (centipoise) to about 1000 cps. The invention is most advantageously used with conformal material which is either solvent free or has a low percentage of solvents. However, it is within the terms of the invention to use the invention with conformal coating material with any typical percentage of solvents, generally known in the industry. It is further within the scope of the invention to spray other types of liquid or viscous materials, as desired.

The coating material 20 is introduced into throughbore 16 at one end of cylindrical extension 12 and flows along the outside of valve shaft 18 and through the outlet end 22 of extension 12. The lower end of valve shaft 18 is preferably tapered and formed to engage a valve seat 24 located in a counterbore 26 formed at the lower end of throughbore 16, adjacent outlet end 22 of cylindrical extension 12. The valve shaft 18 reciprocates between an open, retracted open position, as shown in FIG. 1, in which its lower end disengages from valve seat 24 and opens a discharge outlet 28 therein, and an extended closed position (not shown) in which the lower end of valve shaft 18 engages seat 24 and blocks the discharge outlet 28. The opening and closing of discharge outlet 28 controls the discharge of coating material from throughbore 16 and into nozzle assembly 14 for deposition onto a substrate 11, such as a circuit board.

Referring to FIG. 1, the nozzle assembly 14 includes a nozzle support 32 has a stepped throughbore 34 centered about a vertical centerline 36. Throughbore 34 has an upper, threaded bore section 38 which mates with the external threads on the lower end of extension 12. Throughbore 34 has a second bore section 40, below threaded bore section 38 and adjoined thereto by an outwardly sloped frustro-conical surface 42. Second bore section 40, as illustrated in FIG. 1, is adapted to carry a seal 44, such as an O-ring, which engages seat 24 and forms a fluid tight seal between nozzle assembly 14 and cylindrical extension 12. Throughbore 34 has a third bore section 46, between second bore section 40 and a counterbore 48 disposed adjacent the outlet end 50 of nozzle support 32.

The nozzle support 32 has an air inlet bore 52 disposed on one side of throughbore 34. Inlet bore 52 has an inlet section 54 connected to an air line 56. Air line 56 is connected to the outlet port 64 of a controller, such as a solenoid actuated valve 66. Valve 66 is connected by an air line 68 to a source of pressurized gas, typically air. Opening and closing valve 66 by an external control (not shown), controls the air jets impinging against the coating material being discharged from nozzle support 32. Inlet bore 52 has an outlet section 72 connected to a ring shaped outlet port opening 74 at the outlet end 50 of nozzle support 32.

Figure 2:
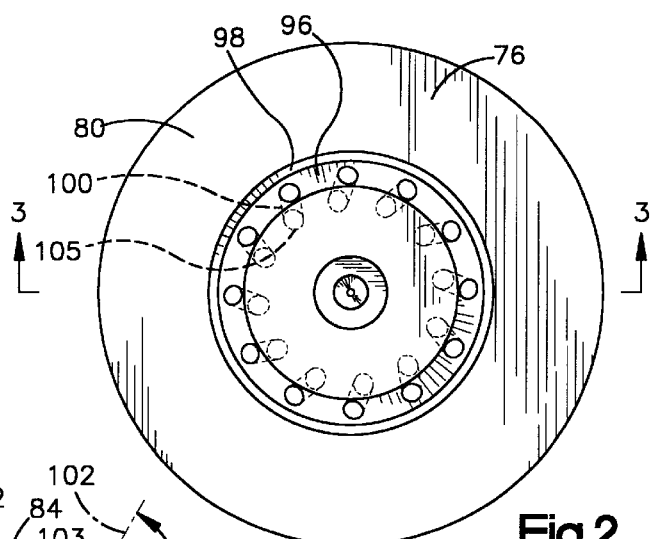
FIG. 2 is a top view of the nozzle with air bores.
Figures 3, 4:
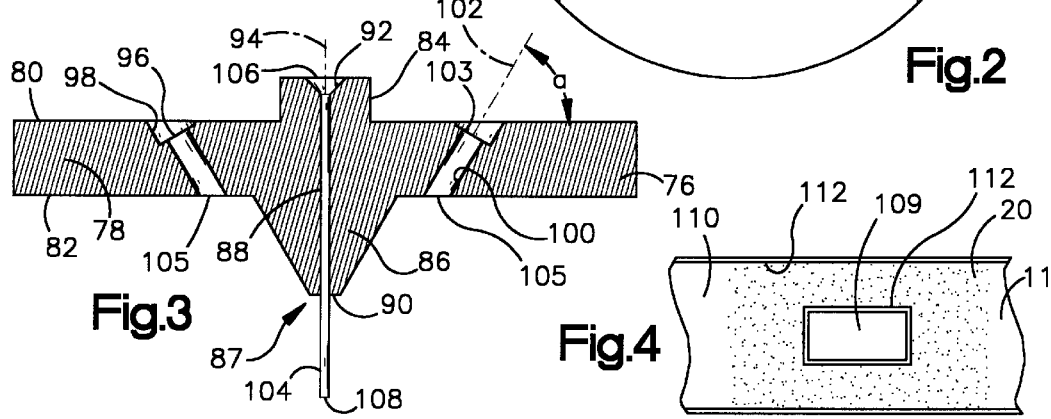
FIG. 3 is a view, in cross section, through line 3—3 of FIG. 2.
FIG. 4 is a top view of a circuit board having a band of coating material applied as an atomized conical spray pattern when the coating system is operating in a first mode and a bead of coating material applied when the coating system is operating in a second mode.
Figure 6:
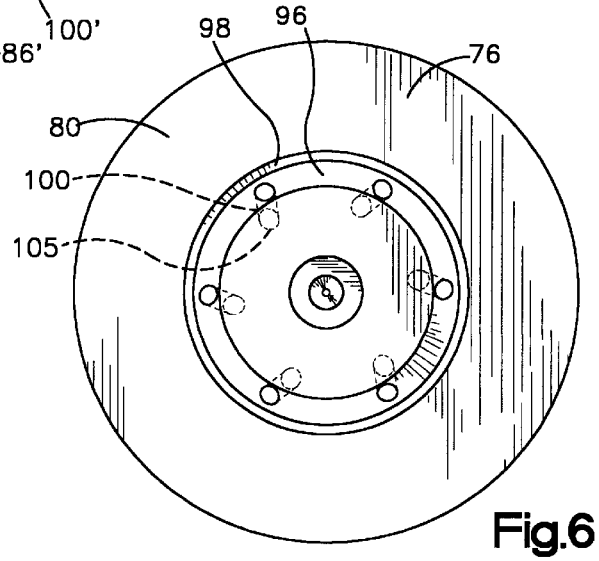
FIG. 6 is an alternative design of a nozzle with six air bores.

Nozzle assembly 14 includes a spray nozzle 76 disposed at the outlet end 50 of the nozzle support 32 and removably secured thereto with a nozzle nut 77 that is threadably secured to the threaded lower end of nozzle assembly 14, as shown in FIG. 1. Referring to FIGS. 1, 2 and 3, the spray nozzle 76 is shown in detail. Spray nozzle 76 is an annular plate 78 having one side formed with a first or upper surface 80 and an opposite side formed with a second or lower surface 82 spaced from the upper surface 80. A boss 84 extends outwardly from the upper surface 80, and an nozzle head 86 extends outwardly from the lower surface 82 concentric to boss 84. A throughbore 88 is formed in spray nozzle 76 between the boss 84 and nozzle head 86 which has a discharge outlet 90. Spray nozzle 76 is mounted against the outlet end 50 of nozzle support 32 so that boss 84 extends into counterbore 48 of throughbore 34. The inlet end 92 of throughbore 88 is formed with a radially inwardly tapering sidewall relative to the longitudinal axis 94 of throughbore 88 and has a generally frustro-conical shape. An annular, V-shaped groove 96 is formed in the upper surface 80 of spray nozzle 76 and extends inwardly toward the lower surface 82. Groove 96 is in flow communication with outlet port 74. As shown in FIGS. 2 and 3, twelve air jet bores 100 with a longitudinal axis 102 are formed in annular plate 78. Bores 100 have an inlet opening 103 intersecting annular groove 96 and an outlet opening 105 intersecting lower surface 82 at 30 degree intervals there along. In the preferred embodiment, the bores 100 have a diameter from about 0.013 inches (13 mils) to about 0.024 inches (24 mils). Preferably, as illustrated in FIG. 3, the longitudinal axis 102 through each air jet bore 100 is formed at an angle "a" of approximately 30 degrees with respect to the longitudinal axis 94 of the throughbore 88. However, it is within the terms of the invention to change the angle "a" to accommodate nozzle tips 86 of different sizes. Also, while the illustrated embodiment is described with twelve, equally spaced jet bores 100, it is within the terms of the invention to use six or more equally spaced jet bores 100, as shown in FIG. 6.

In one embodiment of the invention, nozzle head 86 has an elongated nozzle tip 87 constructed of a tube 104 having an inlet end 106 and an outlet end 108, and is mounted in throughbore 88 and secured therein by conventional means such as brazing. Inlet end 106 of tube 104 preferably extends to the intersection of inlet end 92 and throughbore 88. Outlet end 108 extends outward from the discharge outlet 90 of nozzle head 86 and terminates in a nozzle orifice 107. In the preferred embodiment, tube 104 extends a distance of about 0.250 inches to about 1.0 inches from discharge outlet 90. A bore extending through tube 104 of about 0.008 inches to about 0.050 inches in diameter terminates with a nozzle orifice 107. While tube 104 is shown as being mounted within bore 88 of spray nozzle 76, it is also within the terms of the invention to manufacture nozzle 76 with tube 104 as a unitary element.

As shown in FIG. 1, the longitudinal axis 102 through each of the air jet bores 100 is angled to intersect both a portion of tube 104 projecting outward from discharge end 90 as well as a bead 112 of coating material 20 discharged from the outlet end 108 of the tube. The air flow from jet bores 100 is directed against tube 104 acts to stabilize the tube and reduce any vibration thereof. As discussed in detail below, the jets of air passing through each of the equally spaced air jet bores 100 impact the outside of the bead 112 of coating material 20 to atomize coating material 20 and to cause the atomized coating material to form a conical spray pattern for deposition onto substrate 11. In addition, the jets of air cause the atomized coating material to swirl within the conical spray pattern. Depending on the length of the section of tube 104 which projects from outlet 90, the angle of axis 102 with respect to axis 94 extending through bore 88 can be increased or decreased to control the proportion of air flow impingement against elongated nozzle tip 87 and against bead 112. Also, the spacing of the outlets 105 of jet bores 100 can be spaced closer or further from axis 94 through throughbore 88 as required to further control the proportion of air flow impingement against elongated nozzle tip 87 and against bead 112.

A flow path for coating material 20 extends from cylindrical extension 12 to the nozzle assembly 14 which includes throughbore 16 in extension 12, the discharge outlet 28 of valve seat 24, the throughbore 34 in nozzle assembly 14 and the bore through elongated nozzle tip 87 terminating in orifice 107, respectively. The flow of coating material through this flow path is controlled by valve shaft 18 moving between a retracted, open position relative to discharge outlet 28 in valve seat 24, and a closed, extended position relative to discharge outlet 28.

The system 10, typically used for spraying a circuit board 11 with coating material 20, has two modes of operation for applying the coating material to selective areas of the circuit board without applying the coating material to regions that are to be left uncoated. In a first mode of the present invention when the air jets are directed against the bead of coating material being discharged from the nozzle orifice 107 of elongated nozzle tip 87, a high quality, pin hole free, thin coating of material between about 0.5 mils (0.0005 inches) and about 5 mils (0.005 inches) can be applied to substrate 11. In a second mode of the invention when the air jets are turned off, a bead of coating of material between about 5 mils and about 10 mils can be applied to substrate 11.

In the first mode of operation, valve 66 opens to direct jets of air through air bores 100. Next, the flow of liquid coating material is initiated by moving valve shaft 18 from an extended, closed position relative to discharge outlet 28 in valve seat 24, to an open, retracted position relative to discharge outlet 28. The liquid coating material now flows from a source (not shown) into throughbore 16 in extension 12, through discharge outlet 28 of valve seat 24, through throughbore 34 in nozzle assembly 14, through tube 104 and exits from nozzle orifice 107 of elongated nozzle tip 87 as a bead 112 of coating material. The pressure of the liquid coating material delivered to cylindrical extension 12, in the first mode, is about 5 psi (pounds per square inch) to about 60 psi and preferably between about 10 psi and 30 psi. The jets of air impinge substantially tangential to the outer periphery of bead 112 of coating material discharged from nozzle orifice 107 of elongated nozzle tip 87 to break the liquid coating material into droplets and form an atomized spray having a generally conical shape, as illustrated in FIG. 1. In the first mode of operation, the air is delivered at a pressure of about 10 psi to about 70 psi and preferably about 10 psi to about 20 psi. The atomized spray has a tendency to swirl within the conical shape because of the direction with which the bead of liquid material discharged from the nozzle is impinged from opposing sides by jets of pressurized air from air bores 100 and thereby forms a denser coating on the board. Typically, during application of the coating material 20, the board 11 is held in a stationary position and the robot to which the spray gun is mounted moves the gun in a preprogrammed pattern. A particular advantage of the present invention is that the robot can move in the z axis so that the end 108 of tube 104 is positioned very close to the circuit board, i.e. about 0.250 inches to about 1.0 inches from substrate 11, so that the atomized conical spray pattern is tightly controlled and can be applied near the edges of the circuit board 11 or close to a circuit component 109 mounted to the upper surface 110 of the board. While the first mode of operation is effective for general spraying of circuit boards, a small, but noticeable overspray and splatter is sometimes produced by the conical spray pattern and prevents the use of air impingement when spraying the coating material along the edge of the board or directly adjacent to a region (typically having a circuit component such as a switch) which is to be left uncoated.

Under the latter circumstances, the second mode of operation is employed wherein the air valve 66 is closed and the coating material is applied as a nonatomized bead 112. In the second mode of operation, the coating material is delivered to cylindrical extension 12 at a pressure of about 30 psi to about 60 psi. A particular advantage of the present invention is the ability of the robot to move the end 108 of tube 104 very close to the circuit board 11. For example, when a circuit element 109 projects upward from the upper surface 110 of circuit board 11, as shown in FIG. 4, tube 104 can be positioned very close to the board so that the bead 112 of coating material is applied directly adjacent the circuit element without any contact with the coating material. Then, the robot can raise the end 108 of tube 104 away from surface 110 so that the tube can move across element 109 without any interference therewith. In selected applications, the bead 112 can also be applied along the edges of circuit board 11.

It can be appreciated by one skilled in the art that the two mode system of the present invention is adapted for use with a spray gun which can be automatically controlled by a robot. When an area of a circuit board requires an insulative coating, a first mode is preferably operated to apply an atomized coating of insulative material preferably having a thickness of about 0.5 mils to about 5 mils. However, whenever the area being sprayed is directly next to a region which is to be left uncoated, the system is switched into the second mode whereby a nonatomized bead of coating material is applied. While the coating from the second mode is thicker, i.e. about 5 mils to about 10 mils, than otherwise desired, it is typically only applied to a small, confined area and the overall coating process is economical.

Figure 5:
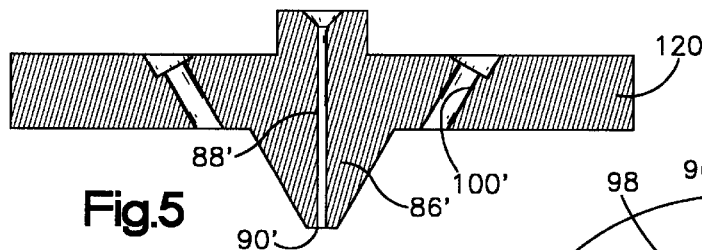
FIG. 5 is a second embodiment of a spray nozzle adapted for use with the coating system of the present invention.

In a second embodiment of the invention, the spray nozzle 76 is replaced with a spray nozzle 120, as shown in FIG. 5, which is identical to nozzle 76 except for the omission of elongated nozzle tip 87 from nozzle head 86. The coating system 10 operates with spray nozzle 120 as described in the first embodiment except for the coating material flowing through throughbore 88' and discharging from discharge outlet 90' of nozzle head 86'. As with the first embodiment, air jets are directed through air bores 100' substantially tangential to the outer periphery of the bead of coating material discharged from nozzle head 86'. Throughout the specification primed numbers represent structural elements which are substantially identical to structural elements represented by the same unprimed number.

While the present invention has been described with reference to using jets of air, it is also within the terms of the invention to use any type of desired gas.

Soft Swirl Mode of Operation

As discussed hereinabove, the coating system 10 is operable in two modes of operation, a first mode dispensing a conical spray of atomized coating material and a second mode dispensing a bead of nonatomized coating material to selectively dispense a conformal (e.g., protective) coating on substrates such as circuit boards.

When applying coating materials to a substrate such as a circuit board, it is important that the transfer efficiency be as high as possible, and there are challenges associated with applying coating material adjacent components on the circuit board.

It is thus an object of the invention to provide the coating system 10 with another, third mode of operation.

According to a feature of the invention, the coating system is operable in an additional third mode of operation, and can be switched between any of the three modes of operation on the fly (while coating a single substrate).

Figure 7A:
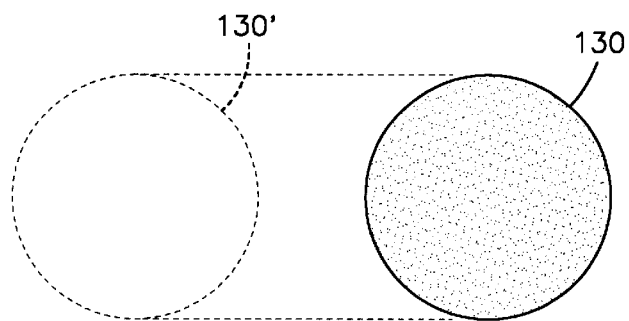
FIG. 7A is an illustration of a pattern of coating material applied onto a substrate in a first (atomizing) mode of operation, according to the invention.

FIG. 7A illustrates a pattern of coating material generated on a substrate in the first (atomizing) mode, discussed hereinabove. As the spray gun (not shown) is moved linearly along the surface of the substrate, a completely filled-in circular pattern of coating material is applied from a first position 130 (shown in solid lines) to a second position 130' (shown in dashed lines) displaced from the first position. As discussed above, the first (atomizing) mode is suitably initiated by at least 10 psi of air pressure.

In the second (bead) mode, a bead of coating material is laid down on the substrate while the spray gun is moved linearly along the surface of the substrate.

In the third (soft swirl) mode of operation, air pressure in the range of from 4 psi to 10 psi is provided, which is sufficient to direct the coating material to a sequence of selected positions on the substrate, but not to atomize it.

Figure 7B:
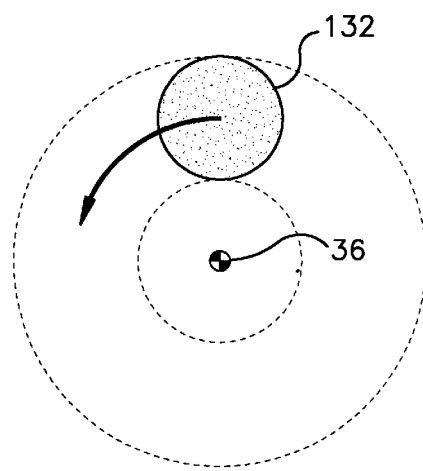
FIG. 7B is an illustration of a pattern of coating pattern applied onto a substrate in a third (soft swirl) mode of operation, in accordance with the invention.

FIG. 7B illustrates the coating pattern that will result from the spray gun being operated in the third (soft swirl) mode when the spray nozzle is not moving with respect to the substrate. This results in a coating pattern of a small, filled-in circle 132 of coating material which moves around the centerline 36 of the spray nozzle 76. The path of the coating material is shown in dashed lines. This would result in a donut-shaped area of coating coverage on the substrate, with a void area.

Figure 7C:
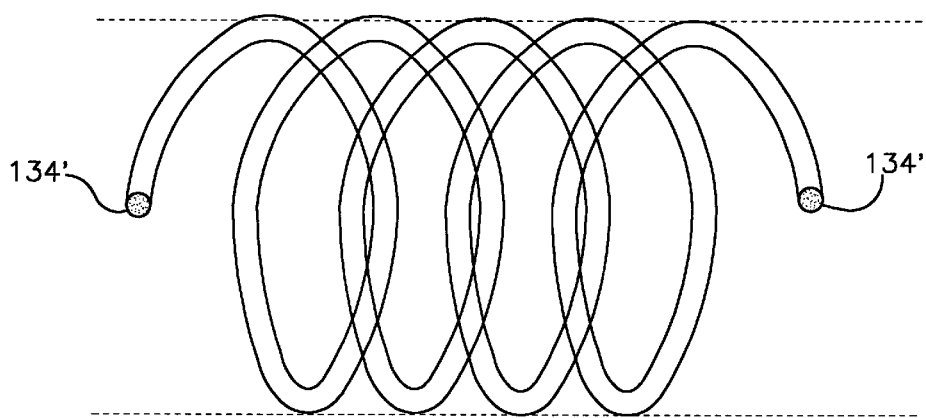
FIG. 7C is an illustration of a pattern of coating pattern applied onto a substrate in the third (soft swirl) mode of operation, in accordance with the invention.

FIG. 7C illustrates the result that would accrue in the third (soft swirl) mode of operation when the spray gun is moving linearly along the surface of the substrate, from a first position 134 (shown in solid lines) to a 134' second position (shown in dashed lines) displaced from the first position. Depending on the speed that the spray gun is moving along the surface of the substrate, this will result in a sinusoidal or overlapping loop (soft swirl) pattern of coating material on the substrate. Such a soft swirl application of coating material (third mode) exhibits 100% transfer efficiency, without atomizing the coating material, and is generally preferred when applying coating material adjacent components on the circuit board substrate. The pattern of coating material deposited onto the substrate in the third (soft swirl) mode of operation is comparable to the spiral patterns of adhesive created by the nozzles in commonly-owned U.S. Pat. No. 4,969,602 issued Nov. 13, 1990, and in commonly-owned U.S. Pat. No. 5,194,115 issued Mar. 16, 1993.

There has thus been described a coating system with three modes of operation: a first pressure-assisted (at least 10 psi) mode wherein coating material is applied as an atomized conical spray pattern onto the substrate; a second non-pressurized mode wherein a bead of coating material is applied onto the substrate; and a third pressure-assisted (at least 4 and less than 10 psi) mode wherein coating material is applied in a soft swirl pattern onto the substrate without being atomized. These three modes may selectively be initiated and employed during the coating of a single substrate to deposit highly conformal coatings on selected areas of the substrate, without waste, thereby minimizing on the expense associated with the coating material. Different areas of the substrate can be coated with the spray gun operating in any one of the three modes.

Slim Swirl

In the coating system 10 described hereinabove, the valve shaft 18 reciprocates between an open, retracted position, as shown in FIG. 1, in which its lower end disengages from valve seat 24, and an extended closed position in which the lower end of the valve shaft 18 engages seat 24 and blocks the discharge outlet 28.

When the discharge outlet 28 is closed off, there is a residual amount of coating material disposed in the volume of the throughbore 34. It has been observed that, when the discharge outlet 28 is subsequently opened (i.e., when the valve shaft 18 disengaged from the valve seat 24), the spray nozzle 76 will drip and dribble coating material upon startup.

It is thus an object of this invention to minimize such drip and dribble upon startup.

According to a feature of the invention, the spray nozzle is disposed in close proximity to the valve seat, thereby minimizing the volume of residual coating material present in the throughbore, and consequently minimizing or substantially eliminating drip and dribble during startup.

Figure 8:
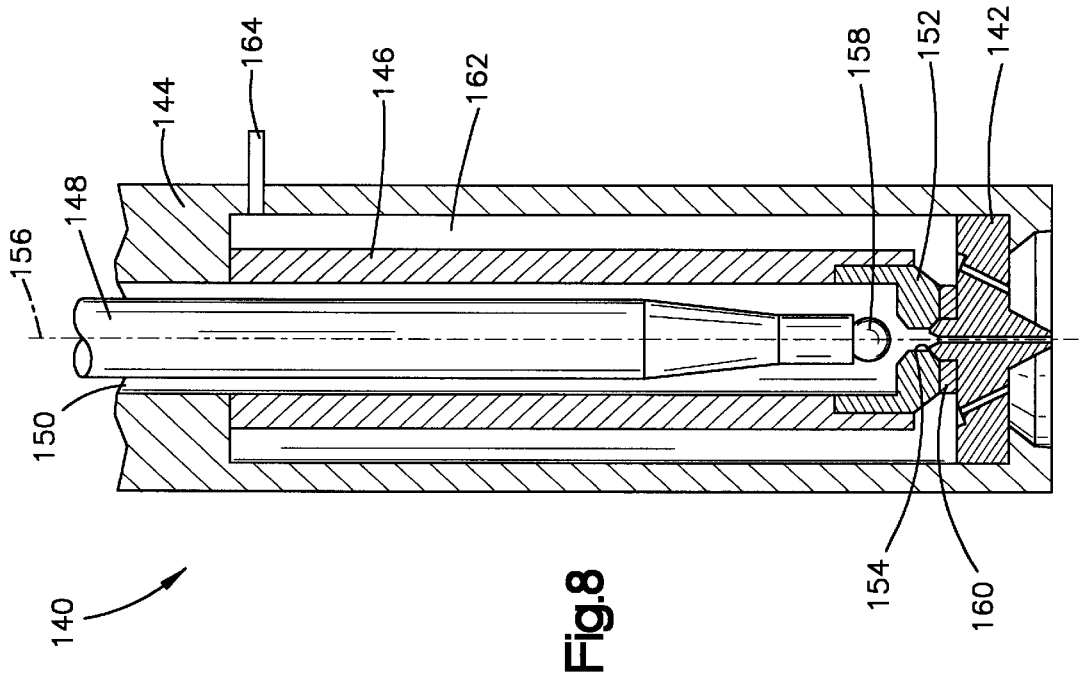
FIG. 8 is a cross-sectional view of a portion of an embodiment of a coating system, according to the invention.

FIG. 8 illustrates a relevant portion of a coating system 140, similar to the coating system 10. Certain common elements between the coating system 140 and the coating system 10 are referred to by their numbers (in parentheses) associated with the coating system 10, for illustrative clarity.

In this embodiment, the spray nozzle 142 is disposed at the end of and is an integral part of the barrel 144 (compare 12). The spray nozzle 142 has air jet bores (100) terminating in outlet openings (105), and has an inlet end (92), a throughbore (88) and a discharge outlet (90), and may be provided with a tube (104) in the manner described hereinabove with respect to the spray nozzles 76 and 87. For purposes of the following discussion, the spray nozzle 142 is identical to the spray nozzle 76.

In this embodiment of a coating system 140, a cylindrical member 146 is disposed within the barrel 144, and the valve shaft 148 (compare 18) is disposed within the cylindrical member 146. The cylindrical member 146 has a throughbore 150 (compare 16) which functions as a fluid delivery passageway. The valve seat 152 (compare 24) is disposed at the end of the cylindrical member 146.

The valve shaft 148, cylindrical member 146, barrel 144, valve seat 152 and spray nozzle 142 are all concentric about a vertical centerline 156 (compare 36).

In use, the valve shaft 148 reciprocates between an open, retracted position, as shown in FIG. 8, in which its lower end disengages from valve seat 152 and opens a discharge outlet 154 (compare 28) therein, and an extended closed position (not shown) in which the lower end of valve shaft 148 engages the valve seat 152 and blocks the discharge outlet 154. The opening and closing of the discharge outlet 154 controls the flow of coating material through the liquid delivery passageway 150 to the spray nozzle 142 for deposition onto a substrate 11, such as a circuit board. In this embodiment, a ball 158 is affixed, such as by brazing, to the lower end of the valve shaft 128 and seals in the extended closed position of the valve shaft 148 against the discharge outlet 154 of the valve seat 152.

The overall construction of the coating system 140 including a spray gun, a source of air and a source of coating material forms no part of this invention per se and is described only briefly herein. The spray gun is operated by a conventional robot which controls the movement of the spray gun in the x, y and z axes.

In this embodiment of a coating system 140, the spray nozzle 142 is disposed closely adjacent the valve seat 152, thereby essentially eliminating residual coating material accumulating in a volume between the valve seat 152 and the spray nozzle 142. The spray nozzle 142 has a boss (84) on its upper surface (80) which fits into a corresponding counterbore (48) on the lower surface of the valve seat 152. To ensure a good seal between the spray nozzle 142 and the valve seat 152, a washer 160 is disposed between the upper surface of the spray nozzle 142 and the lower surface of the valve seat 152. The washer 160 has an inner diameter sufficiently large to fit around the boss on the upper surface of the spray nozzle 142 and an outer diameter which is sufficiently small so as not to block the inlet openings (103) of the air jet bores (100).

In this embodiment of a coating system 140, an air delivery passageway 162 (compare 52) is formed between the outer surface of the cylindrical member 146 and the inner surface of the barrel 144. An upper end of the air passage 162 is sealed off. A lower end of the air delivery passageway 162 is in flow communication with the air jet bores (100) in the spray nozzle 142. Pressurized air is provided to the air passage from any suitable source (not shown), such as has been described hereinabove, through an air inlet 164 extending through the barrel 144 into the air passage 162, so that the coating system 140 may operate in any of the three modes of operation described herein.

Eliminating Pressure Transients

Coating systems operating in various modes of operation, including selectively providing pressurized air (in the first and third modes of operation) and not providing pressurized air (in the second mode of operation) have been described hereinabove. It has been observed that upon initiating a mode which includes providing air pressure, that there is a startup pressure spike which may be up to approximately six (6) times the desired flow rate. This can result in undesirable splatter of coating material on the substrate.

Figure 9:
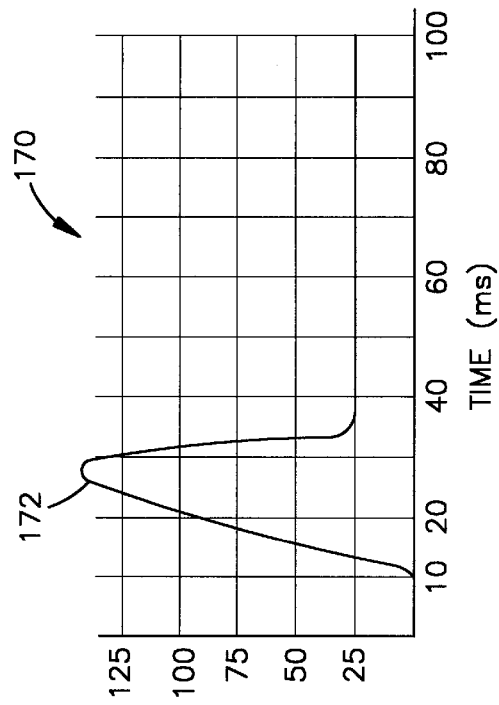
FIG. 9 is a graph illustrating the buildup of air pressure when operating the spray gun of the present invention.

FIG. 9 is a graph illustrating the aforementioned problem of pressure spikes occurring when initiating a mode which includes providing air pressure. The x-axis is time, and the y-axis is pressure). This graph 170 illustrates that it is desired to provide the spray gun with 25 units (e.g., 25 psi) of air pressure, commencing at 10 milliseconds (10 ms) from an initial pressure of 0 psi at t0. As is illustrated by the line 172, a pressure spike commences at 10 ms and continues upward in excess of 125 psi in the interval between 10 ms and approximately 27 ms. Then, between 27 ms and approximately 35 ms the pressure settles down to the desired 25 psi flow rate to operate the spray gun in a pressure-assisted mode (e.g., in the first atomizing mode). It is thus evident that there is a startup pressure spike, lasting 15 ms from startup, which may be up to approximately six (6) times the desired flow rate. This can result in undesirable splatter of coating material on the substrate. What is needed is a technique for providing a soft start upon initiating a pressure-assisted mode of operation.

It is therefore an object of the invention to substantially reduce or eliminate pressure spikes attendant initiating a pressure-assisted mode.

According to an embodiment of the invention, the airflow (pressure) being directed to the spray gun is directed by a valve to an exhaust port in a noncoating mode (or in the second, non-pressurized, non-atomizing, bead coating mode) so that a static-to-dynamic pressure change does not occur upon initiating dispensing the coating material or initiating a pressure-assisted mode of operation (i.e., the first atomizing or third soft swirl operating modes described hereinabove). When the pressure-assisted mode(s) is (are) enabled, a valve simply redirects the airflow to the coating gun rather than to the exhaust port.

Figure 9A:
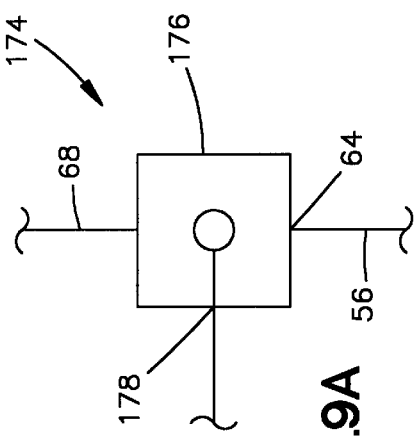
FIG. 9A is a schematic illustration of an embodiment of a soft start aspect of the invention.

FIG. 9A illustrates an embodiment 174 of a soft start technique of the invention, wherein the airflow (pressure) being directed to the spray gun is directed by a valve 176 to an exhaust port over a line 178 in a noncoating mode (or in the second, non-pressurized, non-atomizing, bead coating mode) so that a static-to-dynamic pressure change does not occur upon initiating a pressure-assisted mode of operation. When the pressure-assisted mode(s) is (are) enabled, the valve 176 simply redirects the airflow through an outlet port 64 (see FIG. 1) to the coating gun, over the line 56 (see FIG. 1) rather than to the exhaust port 178. The valve 176 is suitably a solenoid actuated valve and is connected by an air line 68 to a source of pressurized gas, typically air. Opening and closing the valve 176 by an external control (not shown), controls the air jets impinging against the coating material being discharged from the nozzle (76, 142).

Figure 9B:
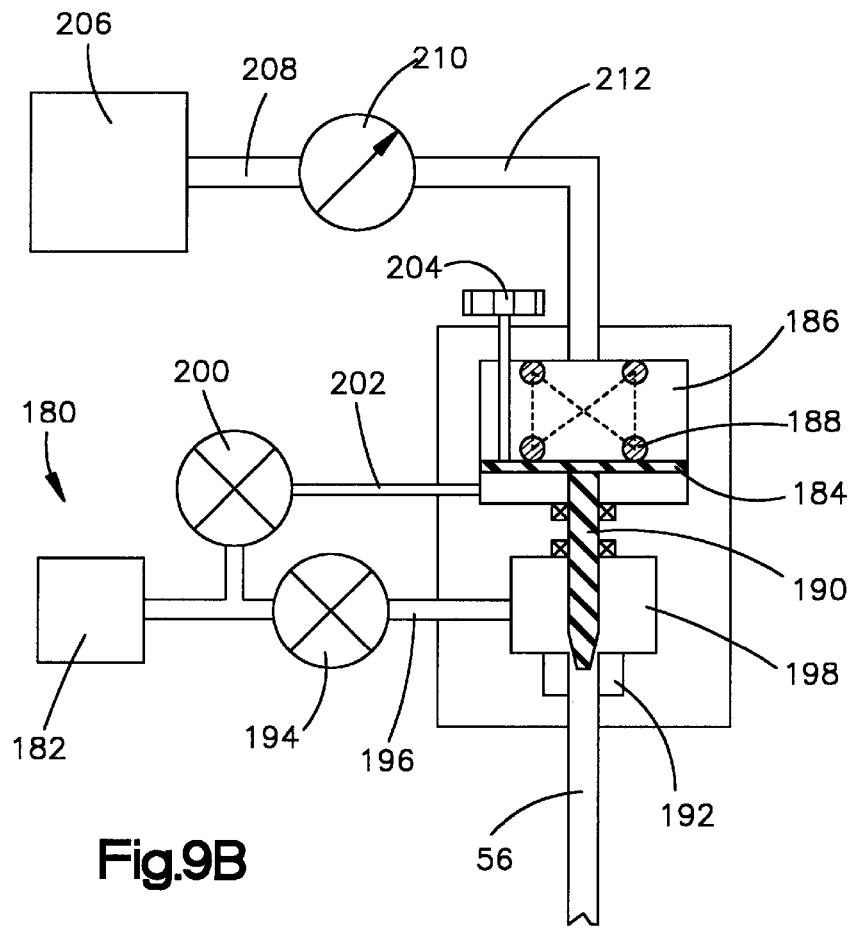
FIG. 9B is a schematic illustration of another embodiment of a soft start aspect of the invention.

FIG. 9B illustrates another embodiment 180 of a soft start technique for eliminating pressure spikes when switching on airflow from a supply 182 of pressurized gas, typically air, to the spray gun over a line 56. Generally, a fluid damping system is provided having the following major components and construction.

A piston 184 is disposed within a cylindrical chamber 186. A spring 188 is disposed atop the piston 184 and a rod 190 extends from the lower surface of the piston 184. The lower (as viewed) end of the rod 190 is suitably shaped (e.g., tapered) to seal against an inlet side of an orifice in a valve seat 192. The rod 190 is illustrated in its "closed" position, against the valve seat 192, and is biased to the closed position by the spring 188 exerting a downward (as viewed) closing force on the piston 184. The line 56 is connected to an outlet side of the valve seat 192.

Pressurized air from the source 182 of pressurized gas is regulated by an air regulator 194, and is provided over a line 196 to a chamber 198 adjacent the valve seat. In this manner, when the rod 190 is in its "open" position (not shown), regulated pressurized air from the source 182 of pressurized gas can flow through the line 56 to the spray gun.

The rod 190 is shown in its closed position, and is moved upward to its open position in any suitable manner such as by providing sufficient air pressure to the bottom side of the piston 184 to overcome the closing force of the spring 188. To this end, a solenoid valve 200 receives unregulated (prior to being regulated by the regulator 194) air pressure from the source 182 of pressurized gas, and an outlet of the solenoid valve 200 is connected via a line 202 to a portion of the cylindrical chamber 186 which is underneath the piston 184. The solenoid valve 200 is switched on (opened) and off (closed) in a manner similar to that in which the opening and closing of the valve 66 was controlled (i.e., by an external control, not shown). The upward stroke of the piston 184 is limited by a set screw 204, such as a thumb screw) entering the top of the cylindrical chamber 186 and acting against the top surface of the piston 184.

Movement of the rod 190 from its closed position to its open position is dampened, in the following manner. The portion of the cylindrical chamber 186 atop the piston 184 is filled with fluid (not shown), such as hydraulic oil which is supplied from an oil reservoir 206. The oil reservoir 206 is connected to the chamber 186 via a line 208 to a flow control valve (orifice) 210, and via a line 212 from the flow control valve 210 to the chamber 186. Damping is effected by the flow control valve 210 restricting the free flow of oil back and forth between the chamber 186 and the reservoir 206. The flow control valve 210 is adjustable, to control the amount of damping exerted on the movement of the piston 184.

In this manner, when a pressure-assisted mode is enabled, unregulated air pressure moves the piston 184 and rod 190 to an open position, regulated air pressure is provided over the line 56 to the spray gun, and pressure transients are absorbed by the damping mechanism of the oil moving through the flow control valve 210 as the piston 184 moves upward, so that the aforementioned pressure transients and splatter are avoided when operating the spray gun in a pressure-assisted mode.

Figure 9C:
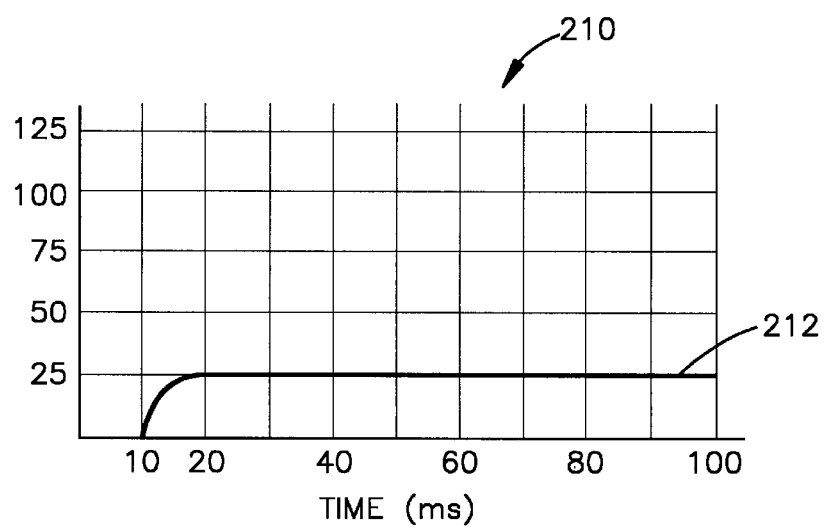
FIG. 9C is a graph illustrating the buildup of air pressure when operating the spray gun of the present invention using the soft start techniques of the invention.

FIG. 9C is a graph illustrating the results achieved by employing the soft start techniques of the embodiments 174 or 180 wherein the aforementioned problem of pressure spikes occurring when initiating a mode which includes providing air pressure is overcome. As with FIG. 9, the x-axis is time, and the y-axis is pressure). This graph 210 (compare 170) illustrates that it is desired to provide the spray gun with 25 units (e.g., 25 psi) of air pressure, commencing at 10 milliseconds (10 ms) from an initial pressure of 0 psi at t0. As is illustrated by the line 212 (compare 172), in the interval between 10 ms and approximately 18 ms, the pressure rises smoothly to the desired exemplary 25 psi flow rate to operate the spray gun in a pressure-assisted mode (e.g., in the first atomizing mode). It is thus evident that the problem of incurring a startup pressure spike, and attendant splatter of coating material upon startup, has substantially been reduced, if not entirely eliminated.

It is apparent that there has been provided in accordance with this invention apparatus and methods for coating selected areas of a circuit board with a liquid coating material without coating regions of the circuit board to be left uncoated that satisfy the objects, means and advantages set forth hereinbefore. In one mode of operation of a first embodiment of the invention, a bead of liquid coating material dispensed from an elongated nozzle tip is atomized by directing jets of air against the bead to form a conical, swirling spray pattern which is sprayed on selected areas of a circuit board where overspray is not a significant concern. In a second mode, the non-atomized bead of liquid coating material dispensed through the elongated nozzle tip is applied on selected areas of the circuit board where overspray cannot be tolerated. In a second embodiment of the invention, a first mode operates by dispensing the bead of liquid coating material from a nozzle without the elongated nozzle tip and atomizing the bead of material by directing jets of air against the bead to form a conical, swirling spray pattern which is sprayed on selected areas of a circuit board where overspray is not a significant concern. In a second mode of the second embodiment, the bead of liquid coating material dispensed from the nozzle without the elongated nozzle tip is applied on selected areas of the circuit board where overspray cannot be tolerated.

While the invention has been described in combination with embodiments thereof, it is evident that many alternatives, modifications, and variations will be apparent to those skilled in the art in light of the foregoing description. Accordingly, the invention is intended to embrace all such alternatives, modifications and variations as fall within the spirit and broad scope of the appended claims.

What is claimed is:

1. A system for spray coating a substrate with a liquid coating material, comprising:

a liquid spray device having a liquid delivery passageway for supplying liquid coating material and an air delivery passageway for supplying pressurized air;

a nozzle mounted to said liquid spray device having a nozzle tip extending outwardly therefrom and having a throughbore in flow communication with said liquid delivery passageway with a nozzle orifice disposed at the end of said throughbore to discharge said liquid coating material as a bead of liquid coating material, said nozzle including a plurality of air bores in flow communication with said air delivery passage to direct pressurized air against the outer periphery of said bead of liquid coating material discharged from said nozzle tip to form said liquid coating material into an atomized spray pattern with said liquid coating material swirling within said atomized spray pattern;

said air bores being in air flow communication with said air delivery passageway by a common opening; said air bores being angled to direct jets of air therefrom to impinge substantially tangential to said outer periphery of said bead of coating material to atomize said bead into a conical spray pattern with said liquid coating material swirling within said conical spray pattern; and a controller operatively connected to said liquid spray device for selectively opening and closing said air delivery passageway of said liquid spray device whereby said bead of liquid coating material discharged from said nozzle orifice is applied to said substrate either as said swirling atomized spray pattern or as said bead of said liquid coating material.

2. The system of claim 1 wherein said nozzle is formed with at least six bores in flow communication with said air delivery passage, said air bores being formed at an angle with respect to said throughbore.

3. The system of claim 2 wherein said nozzle is formed with at least twelve air bores in flow communication with said air delivery passage.

4. The system of claim 2 wherein said elongated nozzle tip includes a tube extending outward from said nozzle, said tube having said nozzle orifice disposed at one end to discharge said liquid coating material as said bead of liquid coating material.

5. The system of claim 4 wherein said nozzle comprises:
an annular plate with a first surface on one side of said plate, and a second surface on a second opposite side of said plate having a nozzle head extending outwardly therefrom, said plate having a throughbore extending between said one side and said nozzle head to receive said tube; and
said plate being formed with said air bores extending between said first surface and said second surface.

6. The system of claim 4 wherein said liquid spray device has a valve shaft movable between an retracted open position in which the lower end of said valve shaft is spaced from a valve seat and uncovers a discharge outlet therein, and an extended closed position in which said lower end engages said valve seat and blocks said discharge outlet to control the discharge of coating material from said liquid spray device.

7. The system of claim 6 wherein said controller is a solenoid valve.

8. The system of claim 1 wherein said controller controls said pressurized air to selectively apply said liquid coating material as a swirling bead of said liquid.

9. The system of claim 1 wherein said controller selectively applies the liquid coating material using three selectable modes including bead pattern, swirling atomized pattern and swirling bead pattern.

10. The system of claim 1 wherein said controller applies liquid coating material to the substrate by selecting a spray pattern based on a predetermined configuration of the substrate.

11. A system for spray coating a substrate with a liquid coating material, comprising:
a liquid spray device having a liquid delivery passageway for supplying liquid coating material and an air delivery passageway for supplying pressurized air;
a nozzle mounted to said liquid spray device having a discharge outlet at one end and having a throughbore in flow communication with said liquid delivery passageway to discharge said liquid coating material as a bead of liquid coating material from said discharge outlet, said nozzle including a plurality of air bores in flow communication with said air delivery passage to direct pressurized air against the outer periphery of said bead of liquid coating material discharged from said discharge outlet to form said liquid coating material into an atomized spray pattern with said liquid coating material swirling within said atomized spray pattern;
said air bores being in air flow communication with said air delivery passageway; said air bores being angled to direct jets of air therefrom to impinge substantially tangential to said outer periphery of said bead of coating material to atomize said bead into a conical spray pattern with said liquid coating material swirling within said conical spray pattern; and
a controller operatively connected to said liquid spray device for selectively opening and closing said air delivery passageway of said liquid spray device whereby said bead of liquid coating material discharged from said discharge outlet is applied to said substrate either as said swirling atomized spray pattern or as said bead of said liquid coating material.

12. The system of claim 11 wherein said nozzle is formed with at least six air bores formed at an angle with respect to said throughbore and in flow communication with said air delivery passage.

13. The system of claim 12 wherein said nozzle is formed with twelve air bores formed at an angle with respect to said throughbore and in flow communication with said air delivery passage.

14. The system of claim 13 wherein said nozzle comprises:
an annular plate with a first surface on one side of said plate, and a second surface on a second opposite side of said plate having a nozzle head extending outwardly therefrom, said plate having a throughbore extending between said first surface and said nozzle head; and
said plate being formed with said plurality of air bores extending between said first surface and said second surface, each of said plurality of air bores being formed at an angle with respect to said throughbore in said plate.

15. A system for spray coating a substrate with a liquid coating material, comprising:
a liquid spray device having a liquid delivery passageway for supplying liquid coating material and an air delivery passageway for supplying pressurized air;
a valve shaft movable between an retracted open position in which the lower end of said valve shaft is spaced from a valve seat and uncovers a discharge outlet therein, and an extended closed position in which said lower end of the valve shaft engages said valve seat and blocks said discharge outlet to control the discharge of coating material from said liquid spray device;
a nozzle mounted to said liquid spray device in close proximity to the valve seat, said nozzle having a nozzle tip extending outwardly therefrom and having a throughbore in flow communication with said liquid delivery passageway with a nozzle orifice disposed at the end of said throughbore to discharge said liquid coating material as a bead of liquid coating material, said nozzle including a plurality of air bores in flow communication with said air delivery passageway to direct pressurized air against the outer periphery of said bead of liquid coating material discharged from said nozzle tip to form said liquid coating material into an atomized spray pattern with said liquid coating material swirling within said atomized spray pattern;
said air bores being in air flow communication with said air delivery passageway by a common opening; said air bores being angled to direct jets of air therefrom to impinge substantially tangential to said outer periphery of said bead of coating material to atomize said bead into a conical spray pattern with said liquid coating material swirling within said conical spray pattern; and
a controller operatively connected to said liquid spray device for selectively opening and closing said air delivery passageway of said liquid spray device whereby said bead of liquid coating material discharged from said nozzle orifice is applied to said substrate either as said swirling atomized spray pattern or as said bead of said liquid coating material.

16. The system of claim 15 wherein said nozzle is formed with at least six air bores in flow communication with said air delivery passage, said air bores being formed at an angle with respect to said throughbore.

17. The system of claim 16 wherein said nozzle is formed with at least twelve air bores in flow communication with said air delivery passage.

18. The system of claim 16 wherein said elongated nozzle tip includes a tube extending outward from said nozzle, said tube having said nozzle orifice disposed at one end to discharge said liquid coating material as said bead of liquid coating material.

19. The system of claim 18 wherein said nozzle comprises:

an annular plate with a first surface on one side of said plate, and a second surface on a second opposite side of said plate having a nozzle head extending outwardly therefrom, said plate having a throughbore extending between said one side and said nozzle head to receive said tube; and said plate being formed with said air bores extending between said first surface and said second surface.

20. The system of claim 19 wherein said controller is a solenoid valve.

21. A system for spray coating a substrate with a liquid coating material, comprising:

a liquid spray device having a liquid delivery passageway for supplying liquid coating material and an air delivery passageway for supplying pressurized air;

a nozzle mounted to said liquid spray device having an elongated nozzle tip extending outwardly therefrom and having a throughbore in flow communication with said liquid delivery passageway with a nozzle orifice disposed at the end of said throughbore to discharge said liquid coating material as a bead of liquid coating material, said elongated nozzle tip including a tube extending outward from said nozzle, said tube having said nozzle orifice disposed at one end to discharge said liquid coating material as said bead of liquid coating material; said nozzle including a plurality of air bores in flow communication with said air delivery passage to direct pressurized air against the outer periphery of said bead of liquid coating material discharged from said elongated nozzle tip to form said liquid coating material into an atomized spray pattern with said liquid coating material swirling within said atomized spray pattern; said nozzle being formed with at least six bores in flow communication with said air delivery passage, said air bores being formed at an angle with respect to said throughbore; and a controller operatively connected to said liquid spray device for selectively opening and closing said air delivery passageway of said liquid spray device whereby said bead of liquid coating material discharged from said nozzle orifice is applied to said substrate either as said swirling atomized spray pattern or as said bead of said liquid coating material.

22. A system for spray coating a substrate with a liquid coating material, comprising:

a liquid spray device having a liquid delivery passageway for supplying liquid coating material and an air delivery passageway for supplying pressurized air;

a valve shaft movable between an retracted open position in which the lower end of said valve shaft is spaced from a valve seat and uncovers a discharge outlet therein, and an extended closed position in which said lower end of the valve shaft engages said valve seat and blocks said discharge outlet to control the discharge of coating material from said liquid spray device;

a nozzle mounted to said liquid spray device in close proximity to the valve seat, said nozzle having an elongated nozzle tip extending outwardly therefrom and having a throughbore in flow communication with said liquid delivery passageway with a nozzle orifice disposed at the end of said throughbore to discharge said liquid coating material as a bead of liquid coating material, said elongated nozzle tip including a tube extending outward from said nozzle, said tube having said nozzle orifice disposed at one end to discharge said liquid coating material as said bead of liquid coating material; said nozzle including a plurality of air bores in flow communication with said air delivery passageway to direct pressurized air against the outer periphery of said bead of liquid coating material discharged from said elongated nozzle tip to form said liquid coating material into an atomized spray pattern with said liquid coating material swirling within said atomized spray pattern; said nozzle being formed with at least six bores in flow communication with said air delivery passage, said air bores being formed at an angle with respect to said throughbore; and a controller operatively connected to said liquid spray device for selectively opening and closing said air delivery passageway of said liquid spray device whereby said bead of liquid coating material discharged from said nozzle orifice is applied to said substrate either as said swirling atomized spray pattern or as said bead of said liquid coating material.

* * * * *